(12) United States Patent
Baeckler

(10) Patent No.: US 10,073,940 B1
(45) Date of Patent: Sep. 11, 2018

(54) MOVE BASED XOR OPTIMIZATION

(71) Applicant: Altera Corporation, San Jose, CA (US)

(72) Inventor: Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 22 days.

(21) Appl. No.: 15/277,436

(22) Filed: Sep. 27, 2016

(51) Int. Cl.
*G06F 17/50* (2006.01)

(52) U.S. Cl.
CPC ...... *G06F 17/5054* (2013.01); *G06F 17/5072* (2013.01)

(58) Field of Classification Search
CPC .................. G06F 17/5054; G06F 17/5072
USPC .......................................... 716/102
See application file for complete search history.

(56) References Cited

U.S. PATENT DOCUMENTS

| | | | | |
|---|---|---|---|---|
| 2006/0218470 A1* | 9/2006 | Dickson | .............. | G06F 11/1076 714/767 |
| 2006/0230366 A1* | 10/2006 | Baumgartner | ........ | G06F 17/505 716/103 |
| 2008/0028347 A1* | 1/2008 | Hiraoglu | ............... | G06F 17/504 716/103 |
| 2015/0199465 A1* | 7/2015 | Alpert | ................. | G06F 17/5072 716/122 |

OTHER PUBLICATIONS

"Nurse scheduling Problem"; Wikipedia.com; https://en.wikipedia.org/wiki/Nurse_scheduling_problem; Sep. 19, 2016.

* cited by examiner

*Primary Examiner* — Suchin Parihar

(74) *Attorney, Agent, or Firm* — Fletcher Yoder, P.C.

(57) ABSTRACT

A computer-implemented method includes receiving a first circuit design comprising a system of XOR gates, iteratively generating a plurality of candidate physical implementations of the system in adaptive logic modules included in logic array blocks of an integrated circuit, determining an overall metric for each of the plurality of candidate physical implementations using an objective function. The overall metric indicates at least an amount of the system that is implemented by each of the candidate physical implementations in a number of moves. The method also includes implementing an enhanced circuit design including a candidate physical implementation based at least in part on the overall metric of the candidate physical implementation on the integrated circuit.

20 Claims, 5 Drawing Sheets

MOVE BASED XOR OPTIMIZATION

BACKGROUND

The present disclosure relates generally to integrated circuits (ICs), which may include programmable logic devices (PLDs) such as field programmable gate arrays (FPGAs). More particularly, the present disclosure relates to generating enhanced circuit designs to implement on PLDs.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits (ICs) take a variety of forms. For instance, programmable logic devices (PLDs) such as field programmable gate arrays (FPGAs) are ICs that may be highly flexible devices. FPGAs include logic that may be programmed after manufacturing to provide functionality that the FPGA may be designed to support. Thus, FPGAs may contain programmable logic, or combinational logic blocks, that may perform a variety of functions on the FPGAs, according to a circuit design of a user. Some applications for the FPGAs, such as error detection and correction circuits, cryptography circuits, and the like, use large, amorphous systems of combinational logic blocks (e.g., XOR, OR, NAND, AND, etc.). The amorphous systems may refer to circuit diagrams that describe logical implementations of large, complex interconnected networks of combinational logic blocks. In one example, an amorphous system may include tangles of numerous intertwined or partially overlapping XOR gates. As may be appreciated, the numerous combinational logic blocks may be arranged and/or organized in millions or billions of candidate physical implementations that enable implementing the amorphous system of combinational logic blocks. In some instances, the physical implementations vary from the logical implementations of the amorphous systems (e.g., an XOR gate with a large number of inputs in the logical implementation may be broken down into multiple XOR gates in the physical implementations).

The physical implementation that is selected to implement the amorphous system may be loaded onto an integrated circuit. As may be appreciated, there may be numerous physical constraints that may affect the choice of the physical implementation of the amorphous system. For example, the integrated circuit may include a set number of logic array blocks (LABs) that are interconnected via logic array block buses. The logic array blocks may each contain one or more adaptive logic modules (ALMs) interconnected via adaptive logic module buses. To implement the physical implementation of the amorphous system, the combinational logic blocks may be converted into the adaptive logic modules, which are grouped in a certain number (e.g., ten) to the logic array blocks. It may be desirable to reduce the number of logic array blocks used by a physical implementation of an amorphous system of combinational logic blocks to enable cost-savings and maintaining contiguous free space of programmable circuitry. However, as may be appreciated, it may be very difficult to find a physical implementation of the amorphous system of combinational logic blocks that can be implemented efficiently on a relatively small number of logic array blocks.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to software programs, methods, and devices for computing efficiently implementing an amorphous system of combinational logic blocks in adaptive logic modules included in logic array blocks of an integrated circuit. In some embodiments, an enhanced circuit design including a candidate physical implementation of the amorphous system may be implemented that reduces the number of logic array blocks used on the integrated circuit. Reducing the number of logic array blocks used may enable cost-savings and may free up configurable space for a customer's use. The candidate physical implementation may be generated by randomly selecting physical implementations of portions of the amorphous system (e.g., moves) and using an objective function to determine a metric for each of the physical implementations.

The best metrics for each move may be stored and compared with metrics for subsequent moves. Generally, moves that produce metrics better than the prior best metric at certain positions are stored as the new best metric and new best move, subpar metrics as compared to the best metric for a certain position may be maintained when within a threshold, and moves that produce metrics below the best metric and outside of the threshold at a certain position may be discarded. It should be appreciated that the disclosed techniques enable searching a massive space with millions or billions of solutions to find a good (e.g., substantially optimal) solution while considering various constraints (e.g., inputs/outputs of the logic array blocks, number of adaptive logic modules allowed per logic array block, etc.).

Various refinements of the features noted above may be employed in relation to various aspects of the present disclosure. Further features may also be incorporated in these various aspects as well. These refinements and additional features may be employed individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
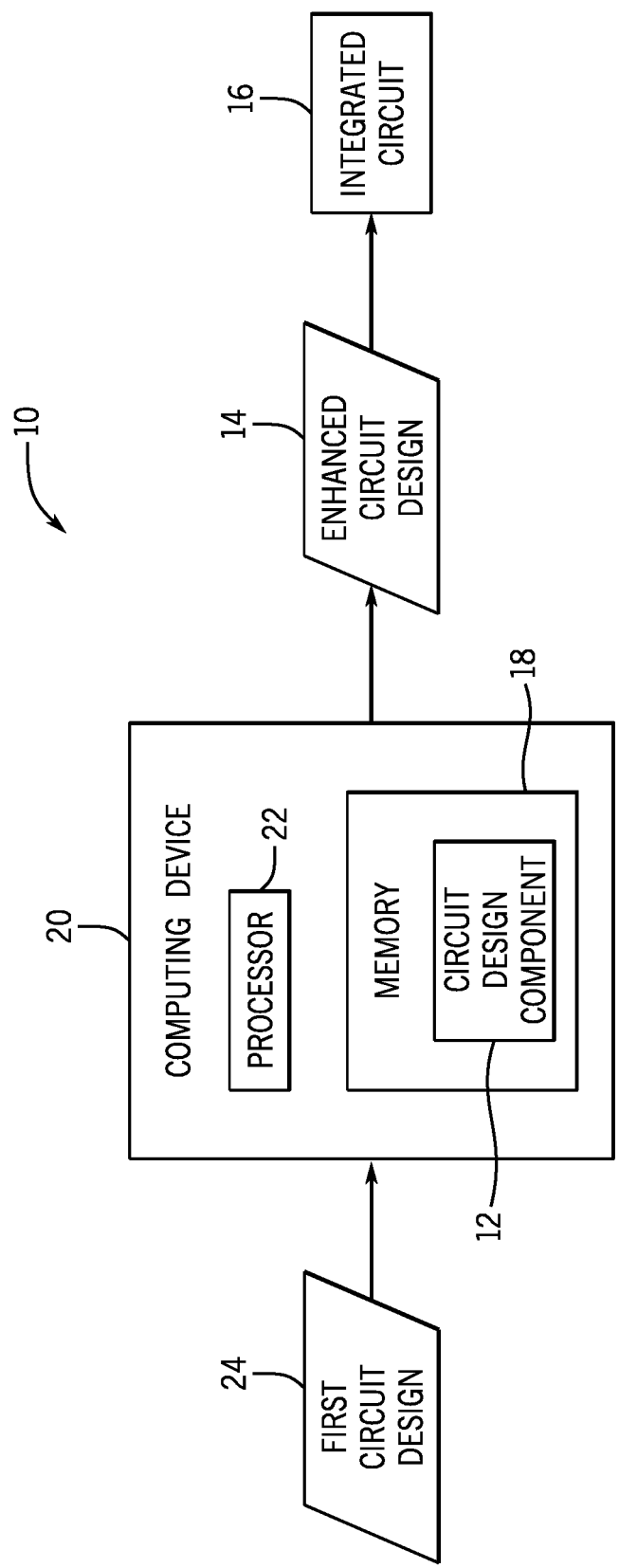
FIG. 1 illustrates a block diagram of a system that utilizes a circuit design component to generate an enhanced circuit design of an amorphous system of combinational logic blocks that is implemented on a reduced number of logic array blocks (LABs) of an integrated circuit, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As noted above, circuits that are used in various applications, such as cryptography, error detection and correction (e.g., cyclic redundancy checks, Reed Solomon), and the like may include large amorphous systems of combinational logic blocks. In some instances, the amorphous systems may include a multitude of combinational logic blocks (e.g., hundreds, thousands, tens of thousands, etc.) that overlap. Thus, there may be millions or billions of candidate physical implementations of the amorphous system that may be found and potentially implemented on an integrated circuit, such as an FPGA. As such, due to the massive space that is searched with the sheer quantity of combinational logic blocks, a physical implementation with a reduced footprint may be difficult and inefficient to find.

Accordingly, some embodiments of the present disclosure relate to providing a circuit design component that generates an enhanced circuit design that includes a physical implementation of an amorphous system of combinational logic blocks (XOR gates) to be implemented on an integrated circuit. The circuit design component may execute a method that uses a random move generator and an objective function that determines a metric for the quality of the move at each position in a physical implementation of an amorphous system. The method may search for a candidate physical implementation that includes a sequence of moves that produces the highest metric in the shortest amount of moves. The method may randomly search moves until an entire search space has been traversed, while at the same time considering various hard and soft constraints when determining a metric for the moves.

Generally, the objective function may determine the highest metric for a candidate physical implementation that implements the entire amorphous system in the fewest moves. It should be noted, that various moves that may produce a lower metric at certain positions than other moves may be kept in consideration if their metric does not exceed a threshold. In this way, an excellent solution that produces the highest metric may be selected and implemented on the integrated circuit that includes one or more subsets of moves with inferior metrics. It should be noted that the candidate physical implementation that is selected may enable reducing the number of logic array blocks used on the integrated circuit, which may free up circuitry on the integrated circuit for additional programming, among other things.

With the foregoing in mind, FIG. 1 illustrates a block diagram of a system 10 that utilizes a circuit design component 12 to generate an enhanced circuit design 14 of an amorphous system of combinational logic blocks that is implemented on a reduced number of logic array blocks (LABs) of an integrated circuit 16, in accordance with an embodiment. The circuit design component 12 may be implemented as processor-executable instructions (software) stored on a memory 18 of a computing device 20 and executed by a processor 22 of the computing device 20. The computing device 20 may include a desktop computer, a laptop computer, a tablet, a server, or the like. Additionally or alternatively, the computing device 20 may be communicatively coupled to a cloud-based computing system that generates the enhanced circuit design 14. The cloud-based computing system may send the enhanced circuit design 14 to the computing device 20 to implement on the integrated circuit 16.

The processor 22 of the computing device 20 may be any type of computer processor or microprocessor capable of executing processor-executable code. Moreover, the processor 22 may include multiple processors or microprocessors, one or more "general-purpose" processors or microprocessors, one or more special-purpose processors or microprocessors, and/or one or more application specific integrated circuits (ASICS), or some combination thereof. For example, the processor 22 may include one or more reduced instruction set (RISC) processors.

The memory 18 may be any suitable articles of manufacture that can serve as media to store processor-executable routines, code, data, or the like. These articles of manufacture may represent non-transitory, computer-readable media (e.g., any suitable form of memory or storage) that may store the processor-executable code or routines used by the processor 22 to perform the presently disclosed techniques. For example, the memory 18 may include volatile memory (e.g., a random access memory (RAM)), nonvolatile memory (e.g., a read-only memory (ROM)), flash memory, a hard drive, or any other suitable optical, magnetic, or solid-state storage medium, or a combination thereof. The memory 18 may be used to store the processor-executable instructions implementing the circuit design component 12, any data (e.g., physical implementations of an amorphous system of combinational logic blocks, metrics associated with the physical implementations, etc.) generated by the circuit design component 12, and the like.

The circuit design component 12 may receive a first circuit design 24 from a designer, a communicatively coupled device (e.g., server, cloud-based computing system, etc.), or the like. The first circuit design 24 may include an amorphous system of a massive number (e.g., hundreds, thousands, tens of thousands, etc.) of networked combinational logic blocks (e.g., XOR gates, OR gates, AND gates, NAND gates, etc.) used in certain applications (e.g., communication, error detection and correction, cryptography, etc.). In some instances, the amorphous system of combinational logic blocks are packed into adaptive logic modules that use an undesirable number of logic array blocks. Thus, the circuit design component 12 may dissect and convert the amorphous system of networked combinational logic blocks into adaptive logic modules in an attempt to find a candidate physical implementation that more efficiently fits onto the integrated circuit 16 using a reduced number of logic array blocks.

The circuit design component 12 may use a move generator and an objective function that determines a metric for the generated moves. The objective function may consider various constraints (e.g., hard, soft, or both) when searching for the candidate physical implementation that covers the entire amorphous system of combinational logic blocks in as few moves as possible. As may be appreciated, the compute time to perform a search over such a massive search space may be substantial. Accordingly, the circuit design component 12 may operate for extended periods of time (e.g., days, weeks, months) generating different candidate physical implementations until a candidate physical implementation is found that generates the highest metric, until time expires, until the designer stops the circuit design component 12, or the like. The candidate physical implementation with the highest metric may be selected and included in the enhanced circuit design 14, which is implemented on the integrated circuit 16. It should be understood that the techniques described herein may enable generating candidate physical implementations that consider various constraints over a massive search space of moves and possible candidate solutions and that results in fewer logic array blocks used than implementing the first circuit design 24.

Figure 2:
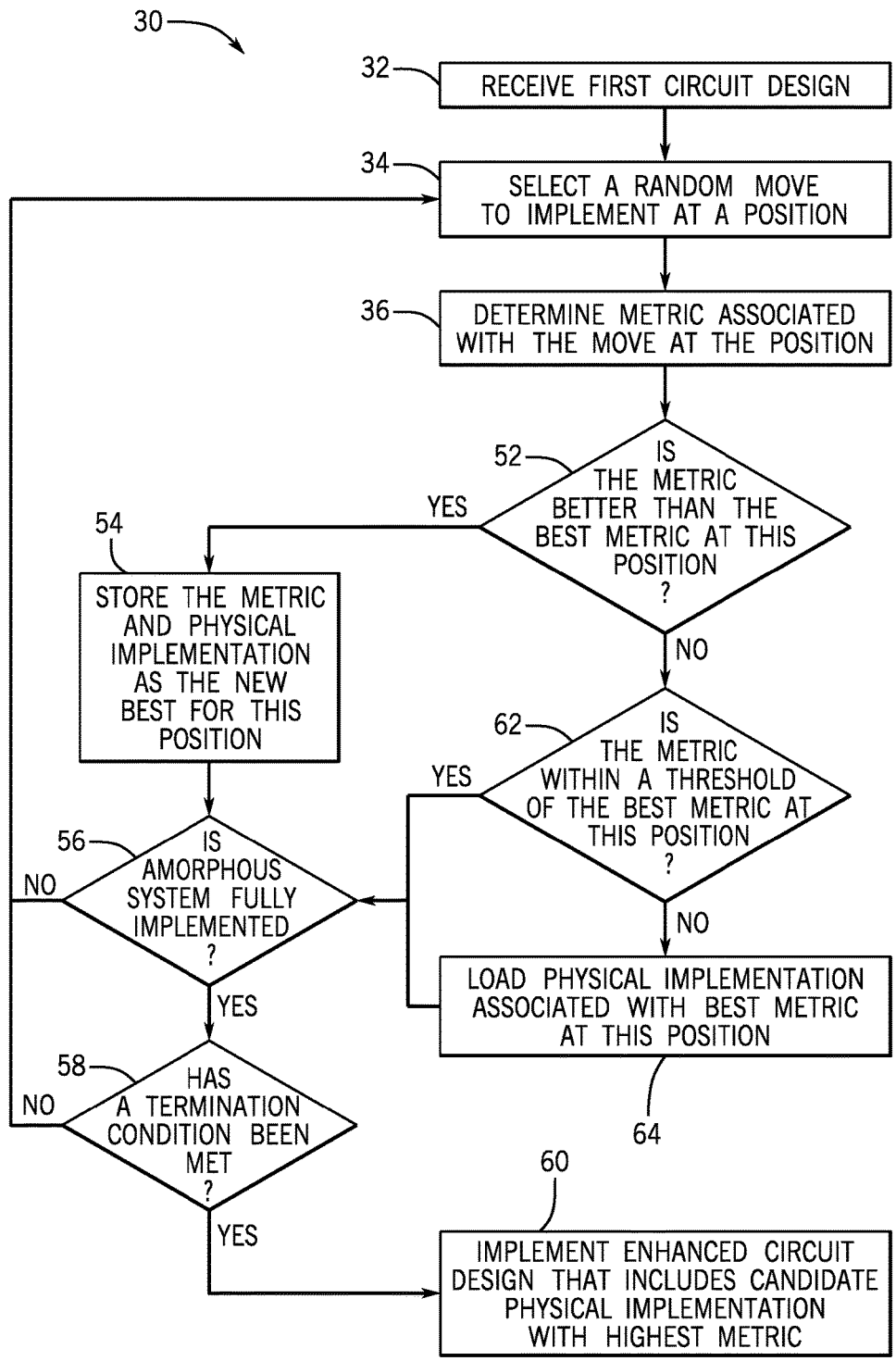
FIG. 2 illustrates a flow diagram of a process suitable for generating the enhanced circuit design of FIG. 1, in accordance with an embodiment.

FIG. 2 illustrates a flow diagram of a process 30 suitable for generating the enhanced circuit design 14 of FIG. 1, in accordance with an embodiment. Although the following description of the process 30 is described with reference to the processor 22 of the computing device 20, it should be noted that the process 30 may be performed by other processors disposed on other devices that may be capable of communicating with the computing device 20, such as a server, a cloud-based computing system, or other components associated with the system 10. Additionally, although the following process 30 describes a number of operations that may be performed, it should be noted that the process 30 may be performed in a variety of suitable orders and all of the operations may not be performed. It should be appreciated that the process 30 may be wholly executed by the computing device 20 or the execution may be distributed between the computing device 20 and/or a server or cloud-based computing system. Further, it should be understood that the process 30 may be implemented as computer instructions of the circuit design component 12 stored on the memory 18.

At a high level, in some embodiments, the process 30 iteratively searches for the best or most optimal (e.g., highest metric) candidate physical implementation of the amorphous system of combinational logic blocks. As described in detail below, the candidate physical implementation that implements the entire amorphous system and uses the fewest number of logic array blocks on the integrated circuit 14 in the fewest number of moves may receive the highest metric. The process 30 may start with an empty database or data structure (e.g., a data structure that has no records related to the candidate physical implementations or their associated metrics). The process 30 may iteratively add and/or modify physical implementations of combinational logic blocks in adaptive logic modules, as well as their associated metrics, based on which physical implementations generate the highest metric for each move at each position. The resulting physical implementation with the highest metric may be implemented on the integrated circuit 16.

Referring now to the details of the process 30, the processor 22 may receive (block 32) the first circuit design 24. The first circuit design 24 may be provided by the designer. In some embodiments, the first circuit design 24 may represent the designer's original circuit design source code written in a high-level programming language. In some embodiments, the first circuit design 24 may be received from a source (e.g., server, cloud-based computing system) external to the computing device 20 via a communication network. As previously discussed, the first circuit design 24 may include an amorphous system of an enormous amount (e.g., millions, billions) of overlapping or intertwined combinational logic blocks (e.g., XOR gates).

The processor 22 may select (block 34) a random move to implement at a position on the integrated circuit 16. More particularly, the position may refer to an adaptive logic module included in a logic array block on the integrated circuit 16. The processor 50 may use a random number generator to randomly select a move to implement. It should be understood that the term "move" may refer to a physical implementation of various XOR gates in an adaptive logic module in a logic array block. Thus, a move may include removing one or more XOR gates from the amorphous system in the first circuit design 24, committing those XOR gates to a specific smaller helper XOR gate, and locking that helper XOR into a certain adaptive logic module in a candidate physical implementation.

It should be noted that there are various Boolean rules for XOR gates that may be applied during division of the amorphous system. Functionality of the amorphous system of XOR gates may be determined by an external protocol (e.g., a protocol may include 64 inputs and 32 outputs, and output number 3 has to be the XOR of inputs {1, 3, 7, 8, 12}). Further, when breaking up multiple large XOR gates into smaller components, it generally costs less to implement if the smaller components can share a common subset. For example, $A^{\wedge}B^{\wedge}C^{\wedge}D$ and $B^{\wedge}C^{\wedge}D^{\wedge}E$ can share a common XOR gate implementing $B^{\wedge}C^{\wedge}D$. In addition, XOR gates exhibit cancellation in that $A^{\wedge}B^{\wedge}B$ is equivalent to A because the two B's cancel each other out.

The processor 22 determines (block 36) a metric associated with the move at the current position. The processor 22 may use an objective (e.g., cost) function to determine the metric. In some embodiments, the metric may include an integer value for how desirable or undesirable the move. The objective function may be formulated to consider the hierarchy of the integrated circuit 16. That is, the objective function may determine higher metrics for moves that fit the amorphous system of XOR gates into adaptive logic modules using fewer logic array blocks because such physical implementations cost less. Thus, there may be an inverse relationship between the metric determined and the cost associated with certain characteristics (e.g., number of logic array blocks used) of the move. In addition, the objective function may determine the metrics for a move based on how much of the amorphous system of combinational logic blocks is implemented by the move.

Additionally, the objective function may consider various constraints when determining the metric. The constraints may include hard constraints and soft constraints. In some embodiments, the hard constraints may not be violated by the candidate physical implementation, and the soft constraints may be violated but it is undesired to do so. For example, FIG. 3 illustrates a schematic diagram of example hard constraints 36 considered when determining the metric, and FIG. 4 illustrates a schematic diagram of example soft constraints 38 considered when determining a metric for a move.

Figure 3:
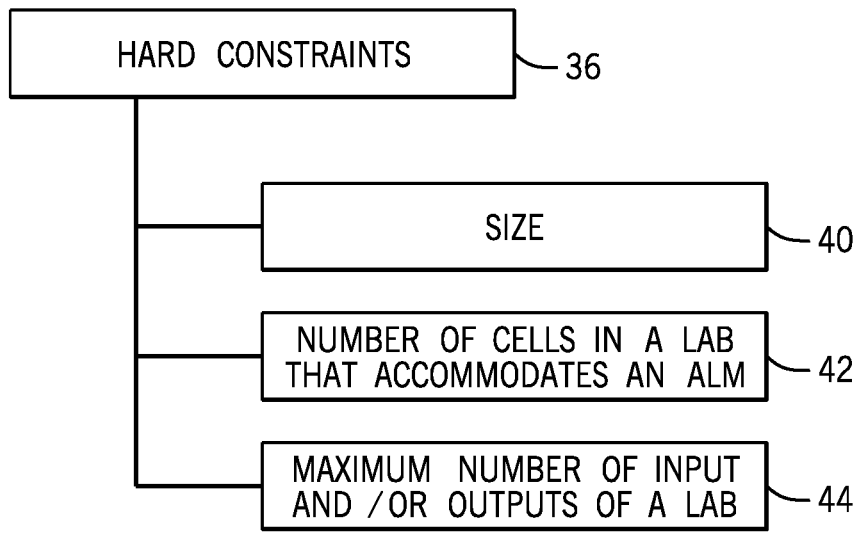
FIG. 3 illustrates a schematic diagram of hard constraints considered when determining the metric for a move, in accordance with an embodiment.
Figure 4:
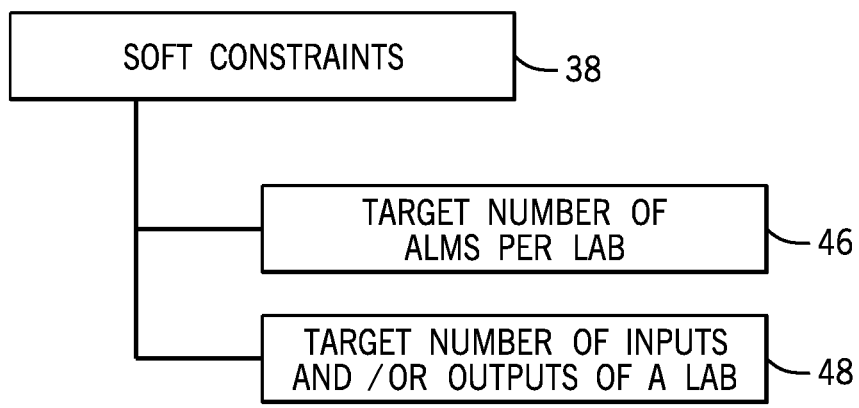
FIG. 4 illustrates a schematic diagram of soft constraints considered when determining the metric for a move, in accordance with an embodiment.

Starting with FIG. 3, the hard constraints 36 may include a first hard constraint 40 related to a maximum size of logic array blocks that may be used by the candidate physical implementation. For example, if more than a certain number (e.g., 12) are used by a candidate physical implementation, then the first hard constraint 40 is violated and the candidate physical implementation may be discarded. A second hard constraint 42 may be related to a number (e.g., ten) of cells (e.g., slots) in a logic array block that accommodates an adaptive logic module that cannot be exceeded. Additionally, a third hard constraint 44 may be related to a maximum number of inputs and/or outputs of a logic array block that cannot be violated. For example, the maximum number of inputs to the logic array block for the set of all the adaptive logic modules included may be approximately 70 to 100, and the maximum number of outputs may be approximately 10 to 30.

Violation of one of the hard constraints 36 may cause a metric to be determined by the objective function that is below a threshold amount. As a result, the processor 22 may discard the current physical implementation that violated the hard constraint and load a physical implementation that includes the highest metric for a particular position. During the first iteration, there may not be any physical implementations stored to load, and thus, the processor 22 may discard the move that violated the hard constraint 36 and select another random move until a move is found at this position that does not violate any hard constraints 36. Additionally or alternatively, the processor 22 may discard the current physical implementation that violates a hard constraint 36 during the first iteration and start over. It should be understood that one objective of the process 30 is to minimize the number of logic array blocks used by a candidate physical implementation.

Figure 5:
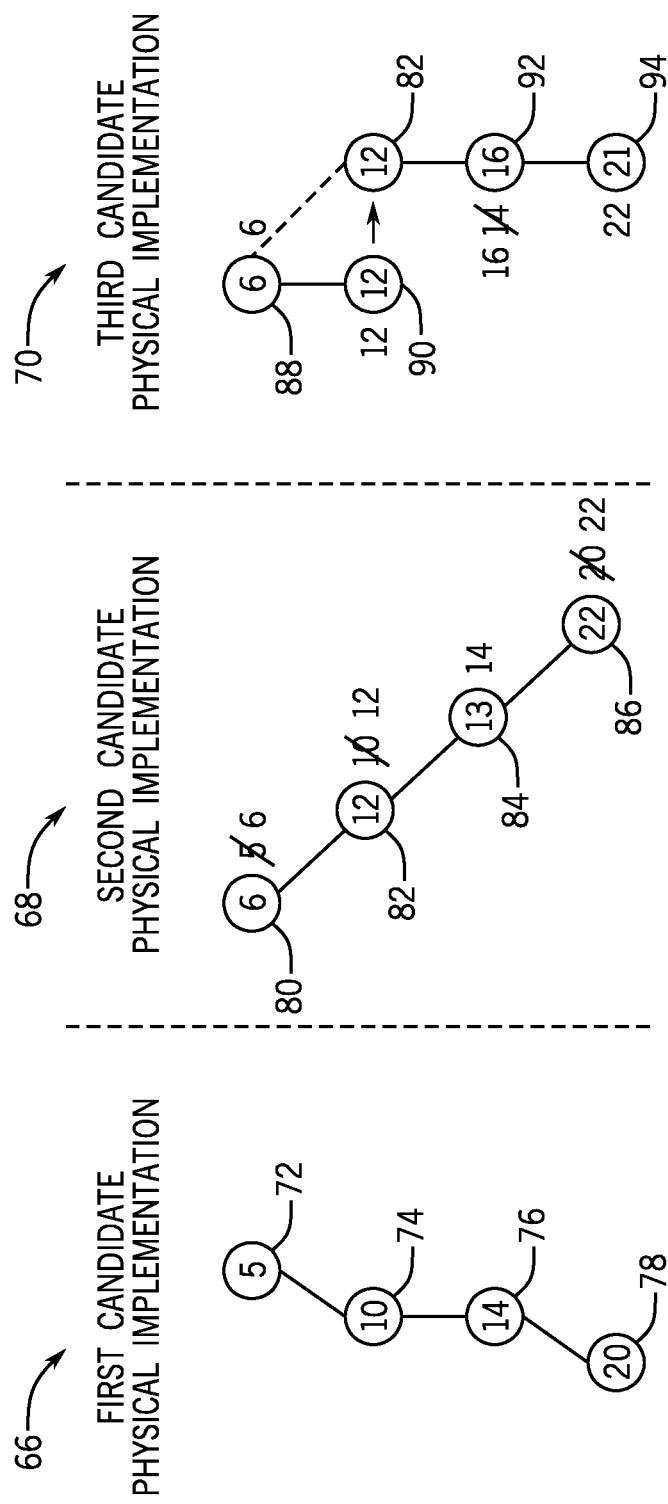
FIG. 5 illustrates example metrics for various moves made in three iterations using the process of FIG. 2, in accordance with an embodiment.

The soft constraints 38 illustrated in FIG. 5 may include a first soft constraint 46 related to a target number of adaptive logic modules per logic array block. For example, in some embodiments, a penalty may be subtracted from a metric of a physical implementation that does not fit the XOR gates into the same number of adaptive logic modules per logic array block. A second soft constraint 48 may relate to a target number of inputs and/or outputs of a logic array block. For example, a penalty may be subtracted from a metric of a physical implementation that includes a number of logic array block inputs above a certain number (e.g., 50). The desirable number of input ports may align with the number of more routable input ports, which may help system level speed and routability.

As may be understood from the above discussion, in some embodiments, a penalty may be subtracted from a metric of a move that violates a soft constraint 38. In some embodiments, if more than a threshold number of soft constraints 38 are violated or if one or more of the soft constraints 38 are violated more than a threshold number of times, then the processor 22 may discard the current physical implementation and load the physical implementation with the highest metric for the particular position. During the first iteration, there may not be any physical implementations stored to load, and thus, the processor 22 may discard the current physical implementation that violates more than a threshold number of soft constraints 38 or violates one or more soft constraints 38 more than a threshold number of times and start over.

Returning to the process 30 illustrated in FIG. 2, the processor 22 may determine (block 52) whether the metric is better than the best metric (e.g., a second metric) at the current position. If the current candidate physical implementation of the amorphous system is the first one being generated by the processor 22, then there are no other metrics stored in the memory 18 (e.g., database) for the current position, and thus, the current metric is the best. Accordingly, the answer to the determination is YES.

If the current candidate physical implementation is the second or subsequent candidate physical implementation, then there is a best metric stored for the current position. In such an instance, the processor 22 may retrieve the best metric for the current position and compare the current metric with the best metric. If the current metric is better (e.g., higher) than the best metric, then the answer is YES. As a result, the processor 22 may store (block 54) the current metric and the current candidate physical implementation associated (e.g., preferred move) with the current metric as the new best for the current position in the memory 18 (e.g., database). That is, the current metric and the current candidate physical implementation may replace the previous best records in the memory 18.

The processor 22 may then determine (block 56) whether the amorphous system is fully implemented in the adaptive logic modules of the logic array blocks. If the answer is NO, then the processor 22 may return to block 34 to select another random move to implement at a subsequent position. It should be understood that, for the first candidate physical implementation, where there are no prior records in the memory 18, the processor 22 may loop through blocks 34, 36, 38, 40, and 42 until the amorphous system is fully implemented in the adaptive logic modules of the logic array blocks. Each of the metrics determined by the objective function for each move may be stored as the best for each position. Thus, the first candidate physical implementation that is generated may serve as the starting point from which to optimize. Generally, the first candidate physical implementation generated is not the candidate physical implementation that generates the highest metric.

When the amorphous system is fully implemented in a candidate physical implementation, the processor 22 may determine (block 58) whether a termination condition has been met. A termination condition may include a certain amount of time transpiring, a target metric being produced by a candidate physical implementation, a threshold number of candidate physical implementations being generated, the designer intervening and stopping the process 30, or the like. If a termination condition is met, then the processor 22 may implement (block 60) the enhanced circuit design 14 that includes the candidate physical implementation with the highest metric on the integrated circuit 16. It should be understood that the candidate physical implementation with the highest metric generally implements the entire amorphous solution of combinational logic blocks in the fewest moves as compared to the other candidate physical implementations.

If the termination condition has not been met, then the processor 22 may return to block 34 to begin generating another candidate physical implementation by selecting a random move to implement at a position. The processor 22 may determine (block 36) a metric using the objective function for the current move at the position. Then, the processor 22 may determine (block 52) whether the current metric is better than the best metric that is stored for the current position. If the answer is YES, then the processor 22 stores (block 54) the current metric and physical implementation as the new best for the current position.

If the answer is NO, that is, the current metric is not better (e.g., is lower) than the best metric, then the processor 22 may determine (block 62) whether the current metric is within a threshold of the best metric at the current position. The threshold may be any suitable integer (e.g., 1, 2, 3, 4, 5, 6, 7, etc.) or percentage (e.g., 5%, 10%, 15%, etc.) and may be configurable by the designer. It should be understood that the threshold may enable flexibility in exploring certain paths that may appear to be less than optimal. Such exploring may be referred to as loss leader exploration, where the current move generates a metric that is less than the best metric for the current position, but the processor 22 continues generating subsequent random moves anyway. In some instances, loss leader exploration may result in a candidate physical implementation that generates the highest metric even though a subset of the moves generated inferior metrics for their respective positions. Loss leader exploration is used because a move with an inferior early metric may result in a better overall metric for a candidate physical implementation.

Loss leader exploration may continue as long as the search for the best (e.g., highest metric) physical candidate implementation remains plausible. Plausibility may be determined based on whether the threshold is or is not exceeded. Thus, when the metric is within the threshold, the processor 22 may return to block 56 to determine whether the amorphous system is fully implemented after the move. If the amorphous system is fully implemented, the processor 22 may proceed to block 58 to determine whether a termination condition is met. If the amorphous system is not fully implemented, the processor 22 may return to block 34 to select another random move and continue processing.

However, when the metric is not within the threshold, that is, the search for the best candidate physical implementation is no longer plausible, then the processor 22 may discard the current candidate physical implementation and load (block 64) the candidate physical implementation associated with the best metric at the current position. The processor 22 may then return to block 56 to determine whether the amorphous system is fully implemented after loading the best candidate physical implementation associated with the best metric at the current position. If the answer is NO, then the processor 22 may return to block 34 to select another random move to implement at a subsequent position in the best candidate physical implementation that was loaded and continues processing through the blocks discussed above.

As may be appreciated, the process 30 may iteratively generate candidate physical implementations that fully implement the amorphous system of combinational logic elements until a termination condition is met. In some embodiments, the process 30 may be executed by the processor 22 for extended periods of time (e.g., days, weeks, months) until a candidate physical implementation is found with a metric that indicates a target number (e.g., 5, 6, 7, 8, 9) of logic array blocks are used. For example, reducing the number of logic array blocks used to implement the candidate physical implementation may produce substantial cost-savings and free up configurable space on the integrated circuit 16, which may be highly desirable to a customer.

It should be noted that, because the objective function generally determines higher metrics for moves that more fully implement the amorphous system, the final move that fully implements the amorphous system in a candidate physical implementation may produce the highest metric. These final metrics for each candidate physical implementation may be referred to as overall metrics for those candidate physical implementations. The processor 22 may compare the overall metrics when selecting the candidate physical implementation to implement on the integrated circuit 16.

As may be appreciated, using the process 30 described above may enable attaining a high metric rather quickly in terms of moves. By comparing the current metric for each move to the best known metric at each position, and terminating paths when a threshold is exceeded, moves that produce better than or relatively similar metrics as the best metric are encouraged. That is, by aggressively pushing up the metrics by insisting on attaining the highest metric as quickly as possible, rather than just by the "end," the process 30 may zoom in on high quality solutions much faster than other techniques. Further, due to loss leader exploration and selecting random moves at each position, the process 30 is able to cover a massive search space while still considering certain hard and soft constraints.

To aid in describing the process 30, FIG. 5 illustrates example metrics for various moves selected for three candidate physical implementations, in accordance with an embodiment. The simplified example candidate physical implementations generated by the processor 22 executing the process 30 include a first candidate physical implementation 66, a second candidate physical implementation 68, and a third candidate physical implementation 70. The moves (e.g., physical implementations of XOR gates from the amorphous system locked into adaptive logic modules packed in logic array blocks of the integrated circuit 16) are represented by nodes in a linked list (e.g., unary tree). The generation of each candidate physical implementation 66, 68, and 70 using the process 30 is explained in detail below.

It should be noted that the first candidate physical implementation 66 is generated when the process 30 first begins and there are no other records (e.g., metrics, candidate physical implementations, etc.) stored in the memory 18. Thus, each move made in the first candidate physical implementation 66 is the best due to no other available moves, and thus, is stored as a new record in the memory 18. For example, the processor 22 began by selecting (block 34) a random move (node 72) to implement at a current position. The processor 22 determined (block 36) a metric of 5 for the move at the position using the objective function. The processor 22 determined (block 52) that the metric of 5 is better than the best metric at the current position because there is no record for a best metric at the current position. Thus, the processor 22 stored (block 54) the metric and the physical implementation that results from the move (node 72) as the new best for this position. The processor 22 then determined (block 56) that the amorphous system is not fully implemented and returned to block 34.

At block 34, the processor 22 selected another random move (node 74) to implement at another position. The processor determined (block 36) a metric of 10 for the move at the position using the objective function. As should be appreciated, the metric of 10 for the current move (node 74) is greater than the metric of 5 for the previous move (node 72) because a larger portion of the amorphous system is implemented after the current move (node 74). To that end, each success move should produce a higher metric from the objective function because each success move should implement more of the amorphous system. The processor 22 determined (block 52) that the metric of 10 is better than the best metric at the current position because there is no record for a best metric at the current position. Thus, the processor 22 stored (block 54) the metric and the physical implementation that results from the move (node 74) as the new best for this position. The processor 22 then determined (block 56) that the amorphous system is not fully implemented and returned to block 34.

At block 34, the processor 22 selected another random move (node 76) to implement at another position. The processor determined (block 36) a metric of 14 for the move at the position using the objective function. The processor 22 stored (block 54) the metric and the physical implementation that results from the move (node 76) as the new best for this position because there are no prior records. The processor 22 then determined (block 56) that the amorphous system is not fully implemented and returned to block 34.

At block 34, the processor 22 selected another random move (node 76) to implement at another position. The processor determined (block 36) a metric of 20 for the final move at the position using the objective function. The processor 22 stored (block 54) the metric and the physical implementation that results from the final move (node 76) as the new best for this position because there are no prior records. The processor 22 then determined (block 56) that the amorphous system is fully implemented. It should be noted that the final metric of 20 is the overall metric for the first candidate physical implementation 66. The processor 22 then determined (block 58) that a termination condition was not met and returned to block 34 to begin generating the second candidate physical implementation 68.

For example, the processor 22 began generating the second candidate physical implementation 68 by selecting (block 34) a random move (node 80) to implement at a position. The processor 22 determined (block 36) a metric of 6 for the current move at the current position using the objective function. The processor 22 also determined (block 52) that the metric of 6 is better than the best metric of 5 at the current position. Thus, the processor 22 stored the current metric of 6 and the physical implementation that results from the move (node 80) as the new best for this position (overwriting the prior best metric of 5 as shown by the strikethrough next to node 80). The processor 22 then determined (block 56) that the amorphous system is not fully implemented and returned to block 34.

At block 34, the processor 22 selected another random move (node 82) to implement at another position. The processor 22 determined (block 36) a metric of 12 for the move at the current position using the objective function. The processor 22 also determined (block 52) that the metric of 12 is better than the best metric of 10 at the current position. Thus, the processor 22 stored (block 54) the current metric of 12 and the physical implementation that results from the move (node 82) as the new best for this position (overwriting the prior best metric of 10 as shown by the strikethrough next to node 82). The processor 22 then determined (block 56) that the amorphous system is not fully implemented and returned to block 34.

At block 34, the processor 22 selected another random move (node 84) to implement at another position. The processor 22 determined (block 36) a metric of 13 for the move at the position using the objective function. The processor 22 also determined (block 52) that the metric of 13 is not better (e.g., not higher) than the best metric of 14 at the current position. Accordingly, the processor 22 determined (block 62) whether the metric is within a threshold of the best metric of 14 at this position. In this example, the threshold is 4; however, it should be understood that any suitable threshold may be set. As such, the metric of 13 is within the threshold of 4 from the best metric of 14, and the processor 22 continued by performing loss leader exploration and returned to block 34.

At block 34, the processor 22 selected another random move (node 86) to implement at another position during loss leader exploration. The processor 22 determined (block 36) a metric of 22 for the final move at the position using the objective function. The processor 22 also determined (block 52) that the current metric of 22 for the final move is better than the best metric of 20 for the current move. Thus, the processor 22 stored (block 54) the current metric of 22 and the physical implementation that results from the move (node 86) as the new best for this position (overwriting the prior best metric of 20 as shown by the strikethrough next to node 86). It should be noted that the second candidate physical implementation 68 produces an overall higher metric of 22 than the first candidate physical implementation 66 even with a move that generated a suboptimal metric. The processor 22 then determined (block 56) that the amorphous system is fully implemented but a termination condition (block 58) has not been met.

As such, the processor 22 returned to block 34 to begin generating the third candidate physical implementation 70 by selecting a new random move (node 88) to implement at a position. The processor 22 determined (block 36) a metric of 6 for the current move (node 88) at the current position using the objective function. The processor 22 also determined (block 52) that the metric of 6 is not better than the best metric of 6 at the current position but that the current metric is within the threshold. Thus, the processor 22 continued processing by determining (block 56) that the amorphous system is not fully implemented and returned to block 34.

At block 34, the processor 22 selected another random move (node 90) to implement at another position. The processor 22 determined (block 36) a metric of 7 for the move at the current position using the objective function. The processor 22 also determined (block 52) that the metric of 7 is not higher than the best metric of 12 for the current position. Further, the processor 22 determined (block 62) that the metric of 7 is not within the threshold of 4 because 7 differs from the best metric of 12 by 5. As such, the processor 22 discarded the move at the current position, as shown by the strikethrough of the node 90. Further, the processor 22 loaded (block 64) the physical implementation associated with the best metric of 12 at this position, as shown by the dashed node 82, and returned to block 56 to determine if the amorphous system is fully implemented.

The processor 22 determined that the amorphous system was not fully implemented, and thus, returned to block 34 to select another random move (node 92) to implement at the next position. The processor 22 determined (block 36) a metric of 16 for the move (node 92) at the current position using the objective function. The processor 22 also determined (block 52) that the metric of 16 is better than the best metric of 14 at the current position. Thus, the processor 22 stored (block 54) the current metric of 16 and the physical implementation that results from the move (node 92) as the new best for this position (overwriting the prior best metric of 14 as shown by the strikethrough next to node 92). The processor 22 then determined (block 56) that the amorphous system is not fully implemented and returned to block 34.

At block 34, the processor 22 selected another random move (node 94) to implement at another position. The processor 22 determined (block 36) an overall metric of 21 for the final move at the current position using the objective function. Although the current metric of 21 is not better than the best metric of 22 for this position, the processor 22 determined that the current metric was within the threshold of 4. The processor 22 then determined (block 56) that the amorphous system was fully implemented and also determined (block 58) that a termination condition was met (e.g., time ran out, three candidate physical implementations were generated, the designer stopped the process 30, etc.). As a result, the processor 22 implemented (block 60) the enhanced circuit design 14 that includes the candidate physical implementation with the highest metric, which in this example is the second candidate physical implementation 68.

Figure 6:
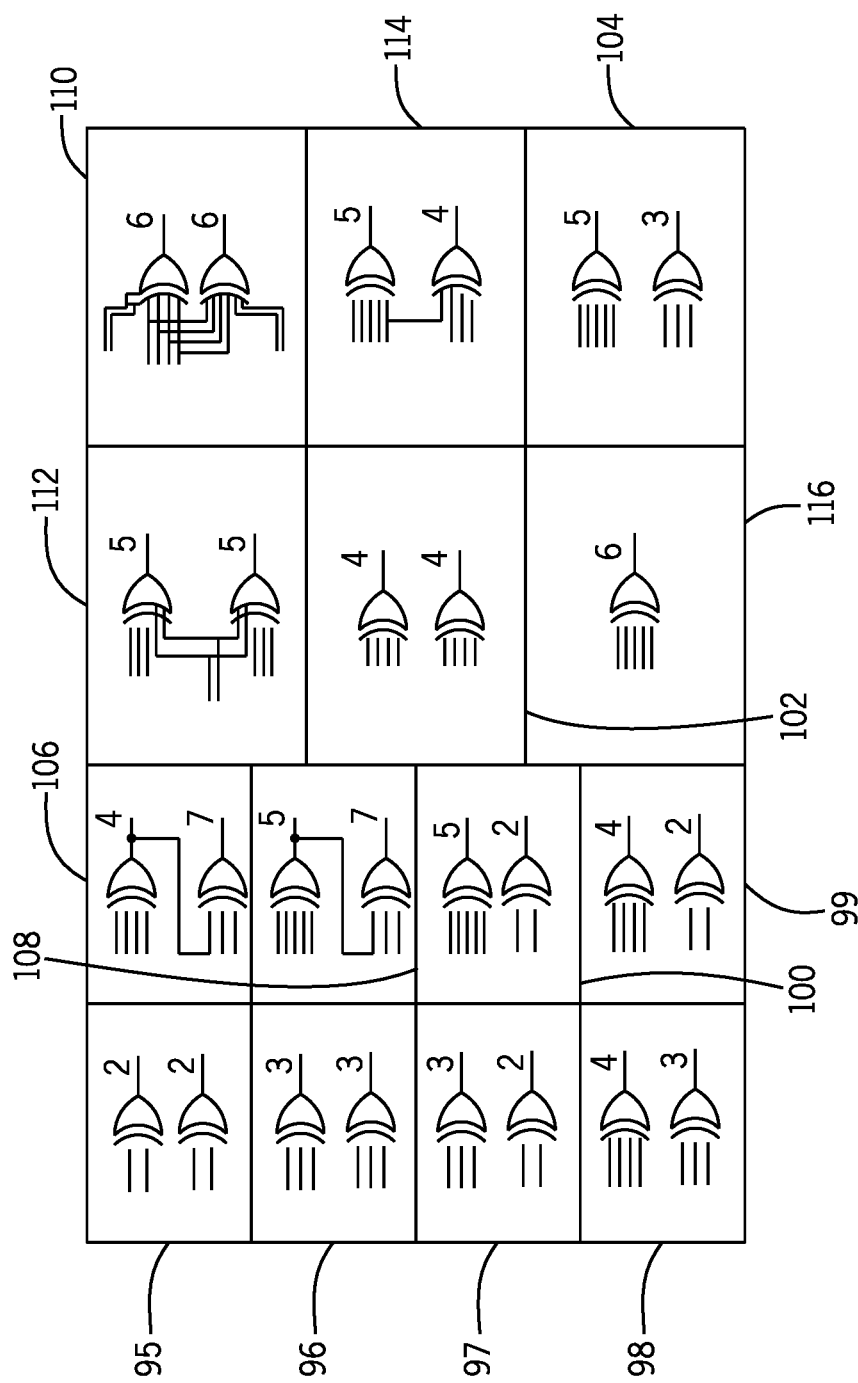
FIG. 6 illustrates a block diagram of example adaptive logic modules including locked in XOR gates, in accordance with an embodiment.

FIG. 6 illustrates a block diagram of example adaptive logic modules including helper XOR gates locked-in during moves, in accordance with an embodiment. In some embodiments, the adaptive logic modules may be fracturable 6 lookup table with sharing capability. Additionally or alternatively, the lookup table of the adaptive logic modules may include various other characteristics. Depending on the pattern of inputs, two helper XOR gates may or may not be able to share space in a single adaptive logic module. The various input patterns may be able to cohabitate in the adaptive logic modules on the same logic array block. Some of the various patterns are explained below.

Adaptive logic modules 95, 96, 97, 98, 99, 100, 102, and 104 include two helper XOR gates with different number of inputs. For example, adaptive logic module 95 includes two helper XOR gates each with two inputs. Adaptive logic module 96 includes two helper XOR gates each with three inputs. Adaptive logic module 97 includes two helper XOR gates one with three inputs and one with two inputs. Adaptive logic module 98 includes two helper XOR gates one with four inputs and one with three inputs. Adaptive logic module 99 includes two helper XOR gates one with four inputs and one with two inputs. Adaptive logic module 100 includes two helper XOR gates one with five inputs and one with two inputs. Adaptive logic module 102 includes two helper XOR gates both with four inputs. Further, adaptive logic module 104 includes two helper XOR gates one with five inputs and one with three inputs.

In some embodiments, the inputs of the helper XOR gates may be cascaded. For example, adaptive logic module 106 includes a first XOR gate with four inputs and an output that is connected as an input to a second XOR gate with three additional inputs. Thus, the second XOR gate has seven total inputs. Adaptive logic module 108 includes a first XOR gate with five inputs and an output that is connected as an input to a second XOR gate with two additional inputs. Thus, the second XOR gate has seven total inputs.

In some embodiments, the inputs of the helper XOR gates may be shared. For example, adaptive logic module 110 includes two helper XOR gates with six total inputs (four of the inputs are shared by both helper XOR gates). Adaptive logic module 112 includes two helper XOR gates each with five total inputs (two of the inputs are shared by both helper XOR gates). Adaptive logic module 114 includes a first helper XOR gate with five inputs and a second helper XOR gate with 4 inputs (the second helper XOR gate shares one input with the first helper XOR gate). Also, in some embodiments, just a single helper XOR gate may be used, as shown in adaptive logic module 116 where the helper XOR gate includes six inputs.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A computer-implemented method, comprising:
receiving, by a processor, a first circuit design comprising a system of XOR gates;
iteratively generating, by the processor, a plurality of candidate physical implementations of the system in adaptive logic modules included in logic array blocks of an integrated circuit;
determining, by the processor, an overall metric for each of the plurality of candidate physical implementations using an objective function, wherein the overall metric indicates at least an amount of the system that is implemented by each of the candidate physical implementations in a number of moves; and
implementing, by the processor, an enhanced circuit design through transmitting the enhanced circuit design to the integrated circuit, wherein the enhanced circuit design includes a candidate physical implementation based at least in part on the overall metric of the candidate physical implementation on the integrated circuit.

2. The method of claim 1, wherein iteratively generating the plurality of candidate physical implementations comprises, for each of the plurality of candidate physical implementations, iteratively:
selecting, by the processor, a current move at random to implement at a current position in one of the adaptive logic modules;
determining, by the processor, a current metric associated with the current move at the current position using the objective function; and
determining, by the processor, whether the current metric is better than a second metric associated with the current position.

3. The method of claim 2, wherein the current move is selected at random using a random number generator.

4. The method of claim 2, wherein:
when the current metric is better than the second metric, the current metric and the current move are stored, by the processor, as a new second metric and a new preferred move for the current position and selecting a subsequent move at random if the system is not fully implemented;
when the current metric is worse than the second metric but within a threshold, selecting, by the processor, a subsequent move at random for a subsequent position if the system is not fully implemented; and
when the current metric is worse than the second metric and is not within the threshold, loading, by the processor, a candidate physical implementation associated with the second metric for the current position and selecting a subsequent move at random for a subsequent position if the system is not fully implemented.

5. The method of claim 4, wherein the threshold comprises an integer difference from the second metric or a percentage of the second metric.

6. The method of claim 1, wherein the objective function considers hard constraints, soft constraints, or both, wherein:
the hard constraints comprise a number of cells in each of the logic array blocks that accommodate an adaptive logic module, a maximum number of inputs, outputs, or both of each logic array block, or some combination thereof; and the soft constraints comprise a target number of adaptive logic modules per logic array block, a target number of inputs, outputs, or both of each logic array block, or some combination thereof.

7. The method of claim 1, wherein the moves each comprise a physical implementation of XOR gates from the system in an adaptive logic module in a logic array block.

8. The method of claim 1, wherein the objective function determines higher metrics for candidate physical implementations that implement a greater percentage of the system in fewer moves.

9. The method of claim 1, wherein iteratively generating, by the processor, the plurality of candidate physical implementations comprises, for each of the plurality of candidate physical implementations, performing loss leader exploration when a metric is determined for a particular move that is not better than a second metric for the particular move but the metric is within a threshold of the second metric.

10. The method of claim 1, wherein a number of potential candidate physical implementations that can be generated is a million or more due to a number of the XOR gates and a nature of connections between the XOR gates in the system.

11. The method of claim 1, wherein the enhanced circuit design includes a candidate physical implementation with the highest overall metric is implemented in 9 or less logic array blocks on the integrated circuit.

12. One or more tangible, non-transitory, computer-readable media, comprising instructions that, when executed by a processor:
   receive, by the processor, a first circuit design comprising a system of XOR gates;
   iteratively generate, by the processor, a plurality of candidate physical implementations of the system in adaptive logic modules included in logic array blocks of an integrated circuit, by, for each of the plurality of candidate physical implementations, iteratively:
      selecting a current move at random to implement at a current position in one of the adaptive logic modules;
      determining a current metric associated with the current move at the current position using an objective function; and
      determining whether the current metric is better than a second metric associated with the current position; and
   determining, by the processor, an overall metric for each of the plurality of candidate physical implementations using the objective function, wherein the overall metric indicates at least an amount of the system that is implemented by each of the candidate physical implementations in a number of moves; and
   implementing, by the processor, an enhanced circuit design through transmitting the enhanced circuit design to the integrated circuit, wherein the enhanced circuit design includes a candidate physical implementation based at least on the overall metric on the integrated circuit.

13. The computer-readable media of claim 12, comprising instructions that, when executed by the processor:
   when the current metric is better than the second metric, store, by the processor, the current metric and the current move as a new second metric and a new preferred move for the current position and select a subsequent move at random if the system is not fully implemented;
   when the current metric is worse than the second metric but within a threshold, select, by the processor, a subsequent move at random for a subsequent position if the system is not fully implemented; and
   when the current metric is worse than the second metric and is not within the threshold, load, by the processor, a candidate physical implementation associated with the second metric for the current position and select a subsequent move at random for a subsequent position if the system is not fully implemented.

14. The computer-readable media of claim 12, wherein the objective function considers hard constraints, soft constraints, or both, wherein:
   the hard constraints comprise a number of cells in each of the logic array blocks that accommodate an adaptive logic module, a maximum number of inputs, outputs, or both of each logic array block, or some combination thereof; and
   the soft constraints comprise a target number of adaptive logic modules per logic array block, a target number of inputs, outputs, or both of each logic array block, or some combination thereof.

15. The computer-readable media of claim 14, wherein any violation of one of the hard constraints causes the objective function to determine a metric for the current move that is outside of a threshold.

16. The computer-readable media of claim 14, wherein any violation of one of the soft constraints causes the objective function to subtract a penalty from the current metric for the current move.

17. The computer-readable media of claim 12, wherein the objective function determines higher metrics for moves that implement a greater percentage of the system in fewer moves.

18. An electronic device, comprising:
   a processor that executes instructions that cause the processor to:
      receive a first circuit design comprising a system of XOR gates;
      iteratively generate a plurality of candidate physical implementations of the system in adaptive logic modules included in logic array blocks of an integrated circuit;
      determine an overall metric for each of the plurality of candidate physical implementations using an objective function, wherein the overall metric indicates at least an amount of the system that is implemented by each of the candidate physical implementations in a number of moves; and
      implement an enhanced circuit design through transmitting the enhanced circuit design to the integrated circuit, wherein the enhanced circuit design includes a candidate physical implementation based at least on the overall metric on the integrated circuit; and
   a memory that stores the instructions.

19. The electronic device of claim 18, wherein iteratively generating the plurality of candidate physical implementations comprises, for each of the plurality of candidate physical implementations, iteratively:
   selecting a current move at random to implement at a current position in one of the adaptive logic modules;
   determining a current metric associated with the current move at the current position using the objective function; and
   determining whether the current metric is better than a second metric associated with the current position.

20. The electronic device of claim 19, wherein:
   when the current metric is better than the second metric, the current metric and the current move are stored as a new second metric and a new preferred move for the current position and selecting a subsequent move at random if the system is not fully implemented;

when the current metric is worse than the second metric but within a threshold, selecting a subsequent move at random for a subsequent position if the system is not fully implemented; and when the current metric is worse than the second metric and is not within the threshold, loading a candidate physical implementation associated with the second metric for the current position and selecting a subsequent move at random for a subsequent position if the system is not fully implemented.

\* \* \* \* \*